(12) United States Patent
Love et al.

(10) Patent No.: US 10,679,954 B2
(45) Date of Patent: Jun. 9, 2020

(54) INTEGRATED CIRCUIT SYSTEM WITH CARRIER CONSTRUCTION CONFIGURATION AND METHOD OF MANUFACTURE THEREOF

(71) Applicant: EoPlex Limited, Hong Kong (CN)

(72) Inventors: David G. Love, Aptos, CA (US); Philip Eugene Rogren, Half Moon Bay, CA (US)

(73) Assignee: EoPLex Limited, Hong Kong (CN)

( * ) Notice: Subject to any disclaimer, the term of this patent is extended or adjusted under 35 U.S.C. 154(b) by 0 days.

(21) Appl. No.: 16/117,483

(22) Filed: Aug. 30, 2018

(65) Prior Publication Data

US 2018/0374809 A1 Dec. 27, 2018

Related U.S. Application Data

(62) Division of application No. 14/976,044, filed on Dec. 21, 2015, now abandoned.

(Continued)

(51) Int. Cl.
*H01L 23/00* (2006.01)
*H01L 23/31* (2006.01)

(52) U.S. Cl.
CPC .............. *H01L 24/05* (2013.01); *H01L 24/03* (2013.01); *H01L 24/96* (2013.01); *H01L 23/3114* (2013.01); *H01L 23/3192* (2013.01); *H01L 24/11* (2013.01); *H01L 24/13* (2013.01); *H01L 24/94* (2013.01); *H01L 2224/031* (2013.01); *H01L 2224/03003* (2013.01); *H01L 2224/0311* (2013.01); *H01L 2224/0312* (2013.01); *H01L 2224/0344* (2013.01); *H01L 2224/0347* (2013.01); *H01L 2224/0391* (2013.01); *H01L 2224/03462* (2013.01); *H01L 2224/03505* (2013.01); *H01L 2224/03845* (2013.01); *H01L 2224/03914* (2013.01); *H01L 2224/051* (2013.01); *H01L 2224/05082* (2013.01); *H01L 2224/05083* (2013.01); *H01L 2224/05084* (2013.01); *H01L 2224/05109* (2013.01); *H01L 2224/05111* (2013.01); *H01L 2224/05116* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01);
(Continued)

(58) Field of Classification Search
CPC ....................................................... H01L 24/03
See application file for complete search history.

(56) References Cited

U.S. PATENT DOCUMENTS 6,709,966 B1 * 3/2004 Hisatsune ........... H01L 21/6835
257/E21.508
6,936,532 B2 8/2005 Sakaida
(Continued)

*Primary Examiner* — Peniel M Gumedzoe
*Assistant Examiner* — Christopher A Johnson
(74) *Attorney, Agent, or Firm* — Horizon IP PTE Ltd

(57) ABSTRACT

A method of manufacture of an integrated circuit system includes: providing a semiconductor wafer with a bond pad; attaching a detachable carrier to the semiconductor wafer, the detachable carrier including a carrier frame portion and a terminal structure; removing the carrier frame portion with the terminal structure attached to the semiconductor wafer; and forming an encapsulation encapsulating the semiconductor wafer, the bond pad, and the terminal structure.

20 Claims, 5 Drawing Sheets

Related U.S. Application Data

(60) Provisional application No. 62/097,066, filed on Dec. 27, 2014.

(52) U.S. Cl.
CPC ............... *H01L 2224/05166* (2013.01); *H01L 2224/05171* (2013.01); *H01L 2224/05184* (2013.01); *H01L 2224/05556* (2013.01); *H01L 2224/05609* (2013.01); *H01L 2224/05611* (2013.01); *H01L 2224/05616* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/11312* (2013.01); *H01L 2224/11334* (2013.01); *H01L 2224/11422* (2013.01); *H01L 2224/11428* (2013.01); *H01L 2224/131* (2013.01); *H01L 2224/94* (2013.01); *H01L 2224/96* (2013.01); *H01L 2924/00012* (2013.01)

(56) References Cited

U.S. PATENT DOCUMENTS

| | | | |
|---|---|---|---|
| 8,525,305 B1* | 9/2013 | Rogren | H01L 24/97 257/666 |
| 9,190,381 B2 | 11/2015 | Kojima | |
| 2003/0222343 A1* | 12/2003 | Sakaida | H01L 21/4853 257/737 |
| 2005/0074954 A1* | 4/2005 | Yamanaka | H01L 27/14618 438/458 |
| 2014/0262003 A1* | 9/2014 | Ogashiwa | B23K 35/3006 156/249 |
| 2014/0346684 A1 | 11/2014 | Kojima | |
| 2016/0049383 A1 | 2/2016 | Woychik et al. | |

* cited by examiner ing # US 10,679,954 B2

INTEGRATED CIRCUIT SYSTEM WITH CARRIER CONSTRUCTION CONFIGURATION AND METHOD OF MANUFACTURE THEREOF

CROSS-REFERENCE TO RELATED APPLICATION(S)

This is a divisional of U.S. patent application Ser. No. 14/976,044 filed Dec. 21, 2015, which claims the benefit of U.S. Provisional Patent Application Ser. No. 62/097,066 filed Dec. 27, 2014, and the subject matters thereof are hereby incorporated herein by reference thereto.

TECHNICAL FIELD

An embodiment of the present invention relates generally to an integrated circuit system, and more particularly to an integrated circuit system with a carrier construction configuration.

BACKGROUND

The demand for smaller and more capable portable electronic systems, combined with the increased level of integration in today's semiconductors is driving a need for smaller semiconductor packages with greater numbers of input-output terminals. At the same time, there is relentless pressure to reduce the cost of all the components of consumer electronic systems.

Additionally, Wafer-Level Packaging (WLP) is blurring the lines between traditional semiconductor wafer fabrication and package assembly. WLP allows packaging of the chips while still in wafer form. In the case of WLP, including Wafer-Level Packaged Quad Flat No-lead (WLP-QFN) semiconductor package, the final package is no larger than the semiconductor device. It can also be made thinner than the original wafer on which the device was fabricated.

However, the manufacturing for the WLP or the WLP-QFN packages often involve monetary cost or processing complexity. Also, the manufacturing processes can involve chemicals, conditions, by-products, or a combination thereof that can have negative environmental impacts.

Thus, a need still remains for an integrated circuit system with a carrier construction configuration. In view of the ever-increasing commercial competitive pressures, along with growing consumer expectations and the diminishing opportunities for meaningful product differentiation in the marketplace, it is increasingly critical that answers be found to these problems.

Additionally, the need to reduce costs, improve efficiencies and performance, and meet competitive pressures adds an even greater urgency to the critical necessity for finding answers to these problems. Solutions to these problems have been long sought but prior developments have not taught or suggested any solutions and, thus, solutions to these problems have long eluded those skilled in the art.

SUMMARY

An embodiment of the present invention provides a method of manufacture of an integrated circuit system, including: providing a semiconductor wafer with a bond pad; attaching a detachable carrier to the semiconductor wafer, the detachable carrier including a carrier frame portion and a terminal structure; removing the carrier frame portion with the terminal structure attached to the semiconductor wafer; and forming an encapsulation encapsulating the semiconductor wafer, the bond pad, and the terminal structure.

An embodiment of the present invention provides an integrated circuit system, including: a semiconductor wafer with a bond pad; a terminal structure directly attached to the bond pad with a conductive connector; and an encapsulation encapsulating the semiconductor wafer, the bond pad, and the terminal structure.

An embodiment of the present invention provides a manufacturing system, including: a carrier frame portion; a release layer directly contacting the carrier frame portion; and a terminal structure directly contacting the release layer and attached to the carrier frame portion for manufacturing an integrated circuit system.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
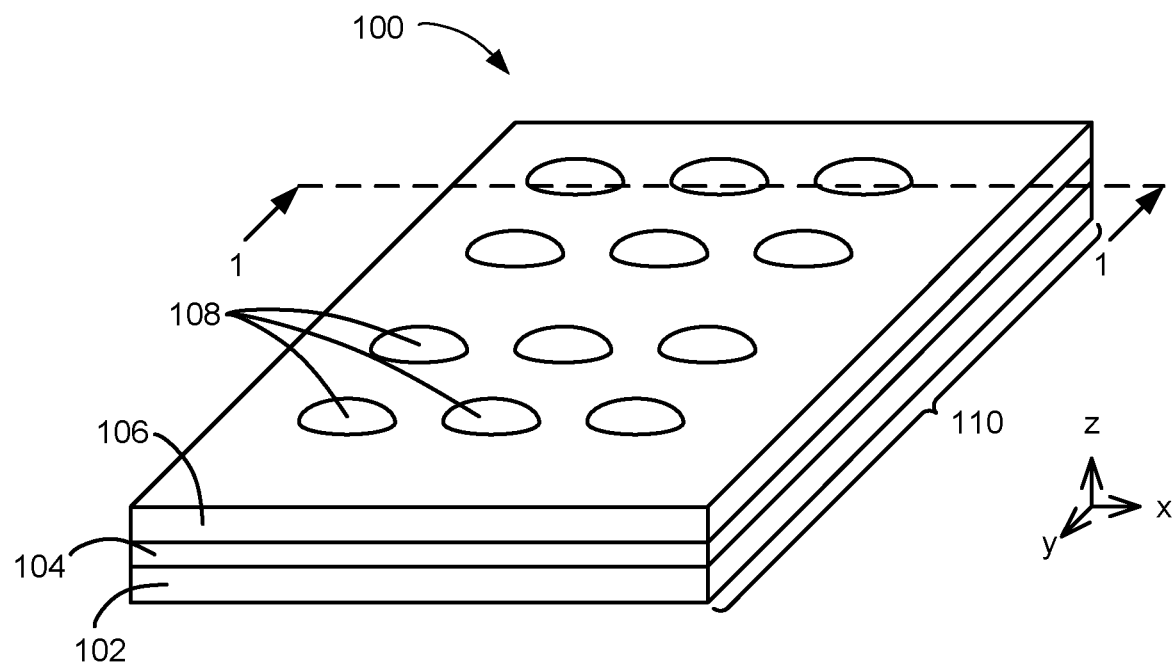
FIG. 1 is an isometric view of an integrated circuit system with carrier construction configuration in an embodiment of the present invention.

An embodiment of the present invention includes

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

Where multiple embodiments or manufacturing processes are disclosed and described, having some features in common, similar or like features in multiple drawing figures will ordinarily be described with similar reference numerals for clarity and ease of illustration, description, and comprehension thereof. For multiple embodiments, the embodiments have been sequenced, such as using first embodiment and second embodiment, as a matter of descriptive convenience and are not intended to have any other significance or provide limitations for the present invention.

For descriptive purposes, the term "horizontal" as used herein is defined as a plane parallel to the plane or surface of reference structure, such as a base structure or a substrate, regardless of its orientation. The term "vertical" refers to a direction perpendicular to the horizontal as just defined. Terms, such as "above", "below", "bottom", "top", "side", "higher", "lower", "upper", "over", and "under" are defined with respect to the horizontal plane, as shown in the figures. The term "on" means that there is direct contact among elements without having intervening materials. The term "processing" as used herein includes attaching or removing material, forming or shaping material, heating, cooling, cleaning, applying, hardening or solidifying, etching, or a combination thereof as required in manufacturing a described structure.

Referring now to FIG. 1, therein is shown an isometric view of an integrated circuit system 100 with carrier construction configuration in an embodiment of the present invention. The horizontal directions can be represented along the 'X-axis' and the 'Y-axis' for FIG. 1. The vertical direction can be represented along the 'Z-axis' for FIG. 1.

The integrated circuit system 100 can be an electronic device. The integrated circuit system 100 can include or be made of semiconductor material. For example, the integrated circuit system 100 can include a WLP device including a WLP-QFN, a die-based package, a lead-frame package, or a ball-grid array package.

For illustrative purposes, the integrated circuit system 100 is described as a WLP-QFN. However, it is understood that the integrated circuit system 100 can include other types of semiconductor integrated circuit packaging device, such as other type of WLP devices, or die-based packages.

The integrated circuit system 100 can include a semiconductor wafer 102, a passivation layer 104, an encapsulation 106, or a combination thereof. The semiconductor wafer 102 can include a slice of semiconductor material, such as silicon or derivatives thereof, including electronic circuits such as transistor devices. The semiconductor wafer 102 can have a thickness along the z-axis of 50-1000 microns, or greater.

The integrated circuit system 100 can include the passivation layer 104 directly contacting a surface of the semiconductor wafer 102. The passivation layer 104 can be over or above the semiconductor wafer 102. The passivation layer 104 can be material such as silicon nitride, oxide, polyimide, or a combination thereof. The passivation layer 104 can be for providing electrical stability by isolating a circuitry portion of the semiconductor wafer 102. The passivation layer 104 can electrically isolate the circuitry portion, physically protect or separate the circuitry portion from other portions or environmental factors, or a combination thereof.

The encapsulation 106 can include material encapsulating the semiconductor wafer 102, the passivation layer 104, a portion thereof, or a combination thereof. The encapsulation 106 can directly contact the semiconductor wafer 102, the passivation layer 104, other components, or a combination thereof. The encapsulation 106 can be formed based on molding, spraying, dipping, curing or hardening, thick film applique, or a combination thereof.

The encapsulation 106 can protect the semiconductor devices on the semiconductor wafer 102. The encapsulation 106 can include an electrical insulator, a material for protecting the electronic circuit from environmental factors, or a combination thereof, such as a polymer or resin material.

For illustrative purposes, the integrated circuit system 100 is shown with the semiconductor wafer 102 and the passivation layer 104 exposed on package perimeter portions 110 of the integrated circuit system 100. However, it is understood that the integrated circuit system 100 can include the encapsulation 106 encapsulating the passivation layer 104, the semiconductor wafer 102, or a combination thereof. The integrated circuit system 100 can include the encapsulation 106 covering the passivation layer 104, the semiconductor wafer 102, or a combination thereof, without the passivation layer 104, the semiconductor wafer 102, or a combination thereof exposed, at the package perimeter portions 110.

Figure 2:
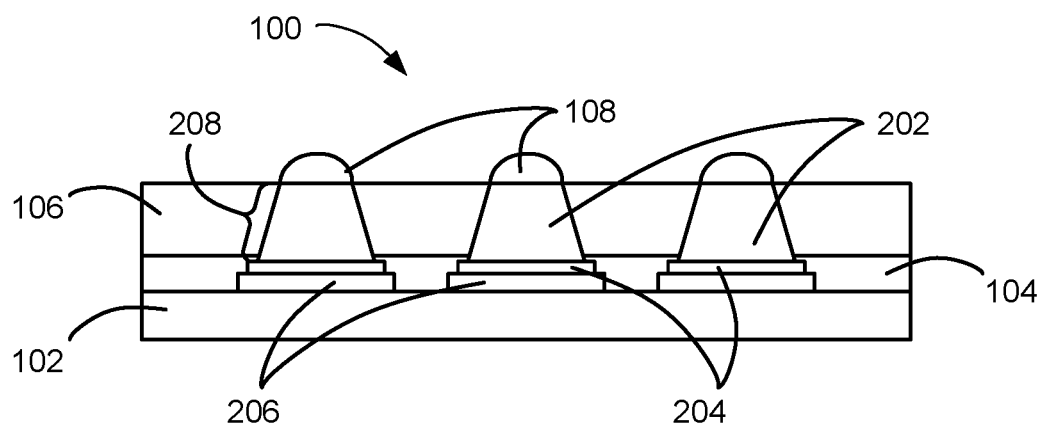
FIG. 2 is a cross-sectional view of the integrated circuit system along a line 1-1 of FIG. 1.

Referring now to FIG. 2, therein is shown a cross-sectional view of the integrated circuit system 100 along a line 1-1 of FIG. 1. The integrated circuit system 100 can include a terminal structure 202, a conductive connector 204, a bond pad 206, or a combination thereof.

The terminal structure 202 is an electrically conductive portion for relaying electrical signals between the semiconductor wafer 102 and a device or a location external to the integrated circuit system 100. The terminal structure 202 can include metal, such as copper, silver, gold, tin, lead, indium, or other similar metals, an alloy, or a combination thereof.

The terminal structure 202 can be formed by a sintering process instead of an electroplating process or a depositing process. The terminal structure 202 can include a characteristic resulting from the sintering process, as discussed in detail below.

The terminal structure 202 can extend to a top surface of the encapsulation 106. A top surface of the terminal structure 202 can be exposed form the encapsulation 106. The terminal structure 202 can be embedded in or encapsulated in the encapsulation 106 along horizontal perimeter portions. The horizontal perimeter or surface of the terminal structure 202 can directly contact the encapsulation 106.

The top surface of the terminal structure 202 can directly contact the solder bump 108. The terminal structure 202 can further extend to a top surface of the conductive connector 204, a top surface of the bond pad 206, or a combination thereof. The terminal structure 202 can directly contact the conductive connector 204, the bond pad 206, or a combination thereof. The terminal structure 202 can further extend to or below a top surface of the passivation layer 104.

The terminal structure 202 can include a tapering shape 208, a solder ball shape, or other geometric shapes. The tapering shape 208 is a physical configuration or outline of the terminal structure 202 where one end is smaller than an opposing end. The tapering shape 208 of the terminal structure 202 can have the top surface exposed from the encapsulation 106 smaller or narrower than portions below, including the bottom portion contacting the conductive connector 204, the bond pad 206, or a combination thereof.

The top surface of the terminal structure 202 can have a surface area or a cross-section along a horizontal plane, a dimension such as along an axis or a radius, or a combination thereof smaller or less than a corresponding measure of the bottom portions. The horizontal surface or portion of the terminal structure 202 can extend between the top and bottom surface along a straight line and gradually decreasing in size from bottom to top as exemplified in FIG. 2 to form a trapezoidal cross-section. The horizontal surface or portion can further be tiered or sectioned in vertically extending between the top portion and the bottom portion, with the top portion smaller or narrower than the bottom portion.

It has been discovered that the terminal structure 202 with the tapering shape 208 provides increased structural integrity and reduced failure rate. The tapering shape 208 of the terminal structure 202 can allow the encapsulation 106 to better hold or retain the terminal structure 202 in place relative to the semiconductor wafer 102 and the bond pad 206. The improved physical connection can provide decrease instances of separation or disconnect between the terminal structure 202 and the bond pad 206 caused by physical shock to the integrated circuit system 100.

The terminal structure 202 can be directly attached to the bond pad 206, the semiconductor wafer 102, or a combination thereof with the conductive connector 204 instead of being formed on the bond pad 206 or the semiconductor wafer 102. Based on the difference, the integrated circuit system 100 can be formed without any seed layer and without any photoresist material, and can result in absence of any remaining seed layer and absence of any remaining photoresist material. The formation and attachment of the terminal structure 202 are discussed in detail below.

The conductive connector 204 can include an attachment for physically joining the bond pad 206 and the conductive connector 204. The conductive connector 204 can further be electrically conductive to provide electrical connectivity between the terminal structure 202 and the bond pad 206. For example, the conductive connector 204 can include solder material, lead, tin, brass, silver, other similar metals, alloy, or a combination thereof.

The bond pad 206 can include a structure and a location on the semiconductor wafer 102 for providing electrical connections to structures external to the semiconductor wafer 102. The bond pad 206 can be terminals or interconnection structures for the semiconductor wafer 102. The bond pad 206 can include aluminum, copper, or a combination thereof.

The passivation layer 104 can directly contact the semiconductor wafer 102, the bond pad 206, or a combination thereof. The encapsulation 106 can directly contact the passivation layer 104, the bond pad 206, the passivation layer 104, or a combination thereof without any remnants of a photoresist layer used in other manufacturing processes. The terminal structure 202 can directly attached to the bond pad 206 using the conductive connector 204 without or instead of any seed layer for forming the terminal structure 202 in other manufacturing processes.

Figure 3:
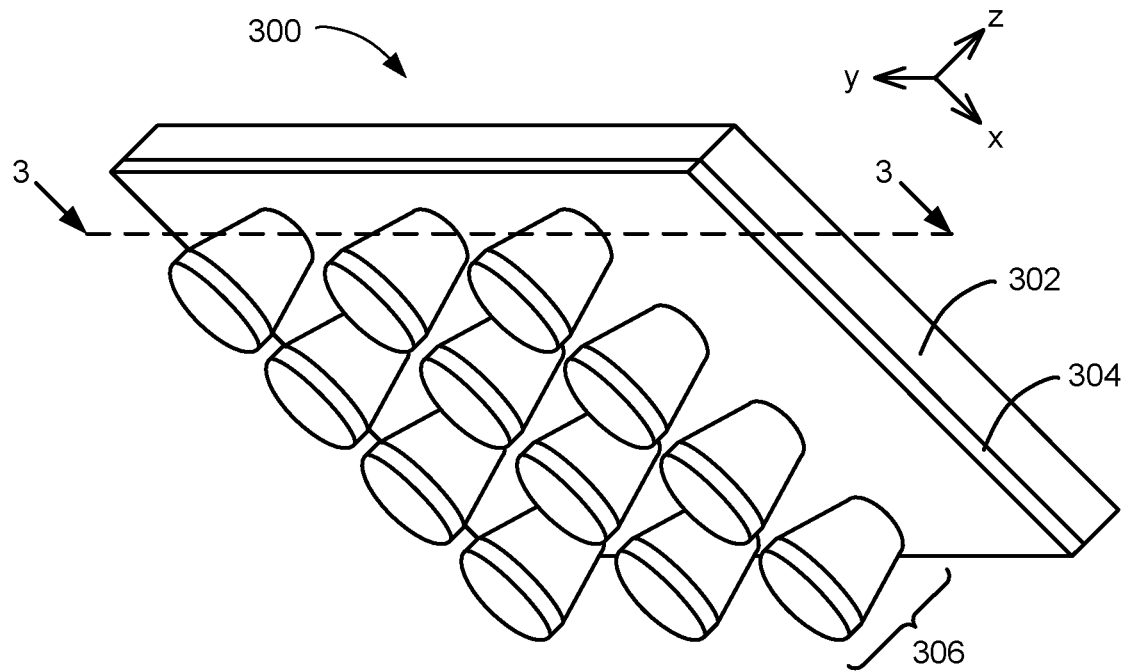
FIG. 3 is an isometric view of a detachable carrier in a further embodiment of the present invention.

Referring now to FIG. 3, therein is shown an isometric view of a detachable carrier 300 in a further embodiment of the present invention. The detachable carrier 300 is a structure utilized in manufacturing the integrated circuit system 100 for forming, locating, attaching, or a combination thereof for the terminal structure 202 of FIG. 2, the conductive connector 204 of FIG. 2, or a combination thereof. For example, the detachable carrier 300 can include a bump carrier, a lead frame, or a combination thereof.

For illustrative purposes, the detachable carrier 300 is shown as a bump carrier for manufacturing a WLP-QFN package. However, it is understood that the detachable carrier 300 can be different. For example, the detachable carrier 300 can be scaled and configured differently for manufacturing a die-based package, such as for lead frames and larger bump carriers accommodating semiconductor dies. Also for example, the detachable carrier 300 can be configured differently for manufacturing other types of WLP packages. The detachable carrier 300 can be singulated for direct application to individual chips or formed in arrays of any size for application to multiple chips in matching arrays instead of wafers.

The detachable carrier 300 can include a carrier frame portion 302, a release layer 304, a terminal pod 306, or a combination thereof. The carrier frame portion 302 is a reference structure for forming, locating, attaching, or a combination thereof for the terminal pod 306 including the terminal structure 202, the conductive connector 204, or a combination thereof.

For example, the detachable carrier 300 can function as a platform for forming one or more instances of the terminal pod 306. The one or more instances of the terminal pod 306 can be formed over the carrier frame portion 302, directly contacting the release layer 304 and supported by the carrier frame portion 302.

Also for example, the carrier frame portion 302 can hold the one or more instances of the terminal pod 306 for physically moving the terminal pod 306 in space. The one or more instances of the terminal pod 306 can be attached or located at a known location relative to the detachable carrier 300. Also for example, the carrier frame portion 302 can physically move and place the one or more instances of the terminal pod 306 at designed locations in manufacturing the integrated circuit system 100.

The carrier frame portion 302 can include a metal with specific thermal characteristics. For example, the carrier frame portion 302 can be formed with metal having melting temperature above temperatures associated with forming the terminal structure 202, such as steel, nickel, an alloy, or a combination thereof.

The carrier frame portion 302 can further have a physical characteristic or a trait for facilitating the manufacturing of the integrated circuit system 100. For example, the carrier frame portion 302 can be relatively stiff for holding or fixing the one or more instances of the terminal pod 306 at a fixed location relative to the carrier frame portion 302 during the manufacturing process. Also for example, the detachable carrier 300 can have a thickness along the z-axis as shown in FIG. 3 for facilitating removal or detachment of the terminal pod 306, such as by peeling or rolling the carrier frame portion 302 and accordingly changing the shape thereof.

The release layer 304 is a portion in the detachable carrier 300 for temporarily providing a detachable bond between the carrier frame portion 302 and the terminal pod 306. The release layer 304 can directly contact the carrier frame portion 302 or can be formed directly on a surface of the carrier frame portion 302. The release layer 304 can prevent a permanent or a strong bond directly between the carrier frame portion 302 and the terminal pod 306. The release layer 304 can be formed on a surface of the carrier frame portion 302, such as by treating or processing the surface of the carrier frame portion 302.

For example, the release layer 304 can be formed by treating a surface of the carrier frame portion 302, such as using a chemical reaction, a physical manipulation, a thermal treatment, or a combination thereof. As a more specific example, the release layer 304 can include an oxide layer formed on the surface of the carrier frame portion 302 by applying or removing a chemical thereon, by heating or cooling the carrier frame portion 302, or a combination thereof. Also as a more specific example, the release layer 304 can be formed by creating irregularities on the surface of the carrier frame portion 302, such as by scoring the surface or applying an abrasive material on the surface.

The release layer 304 can also include adhesive material, such as metal or resin. For example, the release layer 304 can include material that can facilitate detachable bond, such as based on temperature, light, chemical reaction, or a combination thereof. The release layer 304 can include material insoluble with the material for the terminal structure 202 during the manufacturing process.

The release layer 304 can form the surface of the carrier frame portion 302 and the terminal pod 306 or the terminal structure 202 can directly contact the surface of the release layer 304. The release layer 304 can further directly contact and be attached to the carrier frame portion 302, and directly contact and be attached to the terminal pod 306 or the terminal structure 202 on an opposing side.

The terminal pod 306 can include the terminal structure 202, the conductive connector 204, or a combination thereof. The narrower top portion of the terminal structure 202 can be attached to the release layer 304 on the carrier frame portion 302. The terminal structure 202 can extend along the z-axis with the wider or bigger bottom portion of the terminal structure 202 oriented away from the carrier frame portion 302.

The wider or bigger bottom portion of the terminal structure 202 can be below or offset from the release layer 304 along the z-axis. The wider or bigger bottom portion of the terminal structure 202 can include a surface parallel with the release layer 304 or the carrier frame portion 302. The terminal pod 306 can include the conductive connector 204 attached or applied directly contacting the surface on the wider or bigger bottom of the terminal structure 202.

The terminal structure 202 can be formed on the carrier frame portion 302. The terminal structure 202 can be formed based on a sintering process. Details regarding the formation of the terminal structure 202 are discussed below.

Figure 4:
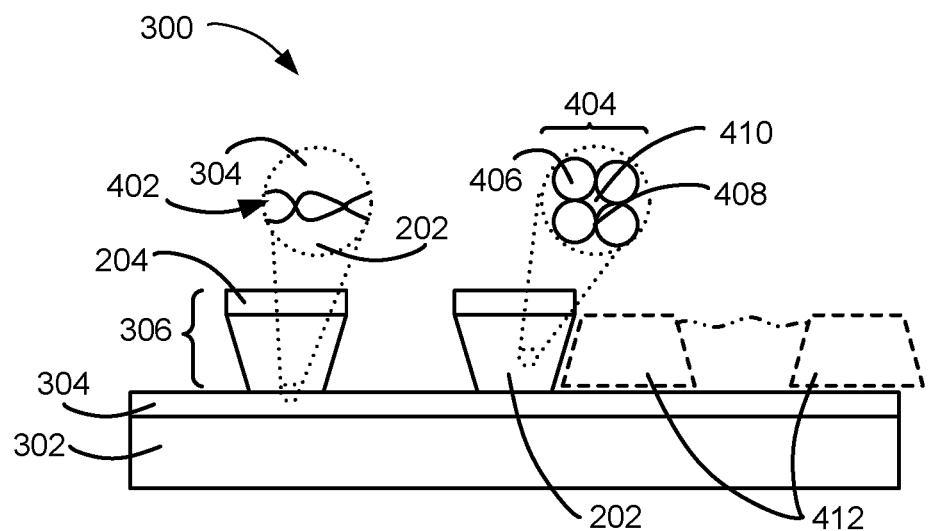
FIG. 4 is a cross-sectional view of the detachable carrier along a line 3-3 of FIG. 3 in the further embodiment of the present invention.

Referring now to FIG. 4, therein is shown a cross-sectional view of the detachable carrier 300 along a line 3-3 of FIG. 3 in the further embodiment of the present invention. The cross-sectional view can show a representation of a release layer characteristic 402, a sintered characteristic 404, or a combination thereof.

The release layer characteristic 402 is a trait for the release layer 304 facilitating temporary detachable bond or connection for the terminal structure 202. The release layer characteristic 402 can be a result of forming the release layer 304. The release layer characteristic 402 can provide a connection amount or strength sufficient for holding or fixing the terminal structure 202 formed or attached on the carrier frame portion 302.

The release layer characteristic 402 can further provide a removable or a breakable connection or bond. The release layer characteristic 402 can be for detaching the terminal structure 202 from the release layer 304, the carrier frame portion 302, or a combination thereof to manufacture the integrated circuit system 100 of FIG. 1.

For example, the release layer characteristic 402 can include a porous or irregular surface of the release layer 304 directly contacting and attached to the terminal structure 202 as illustrated in FIG. 4. Also for example, the release layer characteristic 402 can include a chemical or thermal characteristic of the release layer 304 that can be utilized to attach, remove, or a combination thereof for the terminal structure 202.

The terminal structure 202 can include the sintered characteristic 404. The sintered characteristic 404 is a trait of the terminal structure 202 resulting from a sintering process in forming the terminal structure 202. For example, the sintered characteristic 404 can include, a weight, a size, a density, a shape, a surface condition, or a combination thereof unique for being formed using the sintering process.

As a more specific example, the sintered characteristic 404 can be based on a conductive bond 406 between conductive portions 408 with a separation portion 410 in the terminal structure 202. The conductive bond 406 can include an attachment or a connection between the conductive portions 408, such as metallic elements or structures. The conductive bond 406 can arrange the conductive portions 408 to form the separation portion 410 including a gap or a void between the conductive portions 408.

The terminal structure 202 including the sintered characteristic 404 can be formed directly on the carrier frame portion 302. The carrier frame portion 302 can be provided for manufacturing the terminal structure 202 and the detachable carrier 300. The release layer 304 can be formed on a surface, such as a top surface, of the carrier frame portion 302. The release layer 304 can be formed as discussed above, such as by chemical processing, thermal processing, physical processing, or a combination thereof.

A shaping structure 412 can be placed or formed on top of carrier frame portion 302, the release layer, or a combination thereof. The shaping structure 412 can include a frame, a mold, a photo resist or similar material, or a combination thereof for forming the terminal structure 202. The shaping structure 412 can be formed or placed for complementing and for forming the tapering shape 208 of FIG. 2. The shaping structure 412 can be directly on and contacting the carrier frame portion 302, the release layer 304, or a combination thereof.

The shaping structure 412 can be formed or placed in a variety of ways. For example, the temporary shaping structure 412 can be printed onto the release layer 304 of the carrier frame portion 302. Also for example, the shaping structure 412 can be etched into the carrier frame portion 302 before forming the release layer 304.

Also for example, the shaping structure 412 can include material having a chemical composition, a thermal characteristic, or a combination thereof different from the terminal structure 202. As a more specific example, the shaping structure 412 can include metal, resin, glass, liquid, or a combination thereof different from the material for the terminal structure 202. Also as a more specific example, the material for the terminal structure 202 can have a different melting temperature, a different heating or cooling rate, or a combination thereof than the shaping structure 412.

Manufacturing of the detachable carrier 300 can begin with providing the carrier frame portion 302. The release layer 304 can be formed on a surface of the carrier frame portion 302 as discussed above, such as based on treating the surface of the carrier frame portion 302 or attached to the surface of the carrier frame portion 302. The carrier frame portion 302 can be provided with the shaping structure 412 thereon and the release layer 304 can be formed or placed thereon. The shaping structure 412 can further be formed or placed on or over the release layer 304.

After the temporary shaping structure 412 is formed or placed, the terminal structure 202 can be formed directly on and directly contacting the release layer 304 based on a sintering process for forming the detachable carrier 300. The terminal structure 202 can be formed based on applying a material for the terminal structure 202 to the release layer 304 between the shaping structure 412 or in a void provided by the temporary shaping structure 412.

For example, a solution or a paste including metallic components or elements for the conductive portions 408 can be applied to the release layer 304 in a void provided by the temporary shaping structure 412. As a more specific example, the solution or the paste including powder or flakes of copper, silver, gold, other similar metals, an alloy, or a combination thereof in suspension component can be applied to the release layer 304.

After applying the solution or the paste for the terminal structure 202, the resulting structure can be heated for the sintering process. The metal in the solution can be sintered to form the terminal structure 202. The suspension component, the temporary shaping structure 412, or a combination thereof can be volatilized and removed based on the heat. The sintered characteristic 404, the conductive bond 406 with the separation portion 410 therein, or a combination thereof can be a result of volatilization and the removal of the suspension component during the sintering process.

After the terminal structure 202 is sintered and formed, the conductive connector 204 can be applied or attached to the terminal structure 202. The conductive connector 204 can be applied or attached to a surface of the terminal structure 202 opposite to the release layer 304, wider or bigger than a surface attached to the release layer 304, or a combination thereof. The application or attachment of the conductive connector 204 to the terminal structure 202 can form the terminal pod 306. The detachable carrier 300 can be flipped or rotated about a horizontal line afterwards as shown in FIG. 4.

It has been discovered that the integrated circuit system 100 including the terminal structure 202 with the sintered characteristic 404 provides lower manufacturing cost and simpler manufacturing process. Forming the terminal structure 202 directly on the carrier frame portion 302 using the sintering process and then using the detachable carrier 300 to manufacture the integrated circuit system 100 can eliminate such processes as sputtering, photolithography, and electroplating for forming the terminal structure 202 on the bond pad 206 of FIG. 2. The formation and use of the terminal structure 202 with the sintering characteristic can eliminate steps for creation of a field metal by sputtering, application of thick photoresist and exposure/development, electroplating, and then removal of the resist and field metal by etching.

It has further been discovered that the integrated circuit system 100 manufactured using the detachable carrier 300 including the terminal structure 202 provides lower failure rate improving manufacturing yield and reliability. The removal of the photoresist can be eliminated along with associated potential damage to the semiconductor wafer 102 of FIG. 1.

It has further been discovered that the release layer 304 having the release layer characteristic 402 provides lower manufacturing cost and simpler manufacturing process. The release layer 304 having the release layer characteristic 402 can allow the terminal structure 202 to be formed directly on the carrier frame portion 302 while allowing for detachability between the terminal structure 202 and the carrier frame portion 302. The terminal structure 202 for the integrated circuit system 100 can be formed without utilizing additional deposition, photoresists, chemical etching, or a combination thereof, eliminating total number of processing steps and associated costs, and further eliminating any use of harmful chemicals or creation of harmful byproducts.

Figure 5:
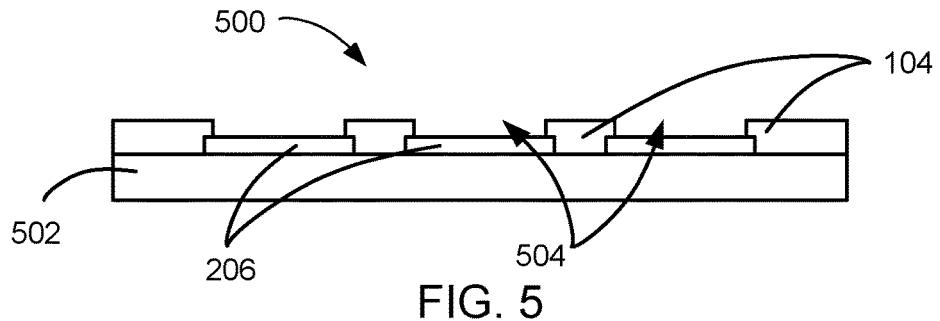
FIG. 5 is a cross-sectional view of a base integrated circuit structure in a manufacturing step of the integrated circuit system of FIG. 1 along the line 1-1 of FIG. 1.

Referring now to FIG. 5, therein is shown a cross-sectional view of a base integrated circuit structure 500 in a manufacturing step of the integrated circuit system 100 of FIG. 1 along the line 1-1 of FIG. 1. Providing or manufacturing the base integrated circuit structure 500 including the semiconductor wafer 102 of FIG. 1 can be a starting point for manufacturing the integrated circuit system 100.

The base integrated circuit structure 500 can be a base wafer with full semiconductor layers. The base integrated circuit structure 500 can include a full circuit layer 502, such as a full semiconductor layer or wafer prior to a thinning process including the semiconductor wafer 102. The full circuit layer 502 can be processed or thinned to form the semiconductor wafer 102. The semiconductor wafer 102 can be a "reconstituted wafer" formed from multiple chips assembled from different wafers.

The base integrated circuit structure 500 can include the bond pad 206, such as including aluminum or copper directly contacting, integral with, directly attached to, or a combination thereof relative to the full circuit layer 502. The base integrated circuit structure 500 can include the semiconductor wafer 102 with the bond pad 206.

The base integrated circuit structure 500 can include the passivation layer 104 directly contacting the semiconductor wafer 102, the bond pad 206, or a combination thereof. The passivation layer 104, such as including silicon nitride, oxide or polyimide, or a combination thereof, can be patterned over the full circuit layer 502, the bond pad 206, or a combination thereof.

The passivation layer 104 can be patterned including a connection pattern 504 with openings or voids over the bond pad 206. A top surface of the bond pad 206 can be exposed from the passivation layer 104 and remain uncovered through the connection pattern 504.

Figure 6:
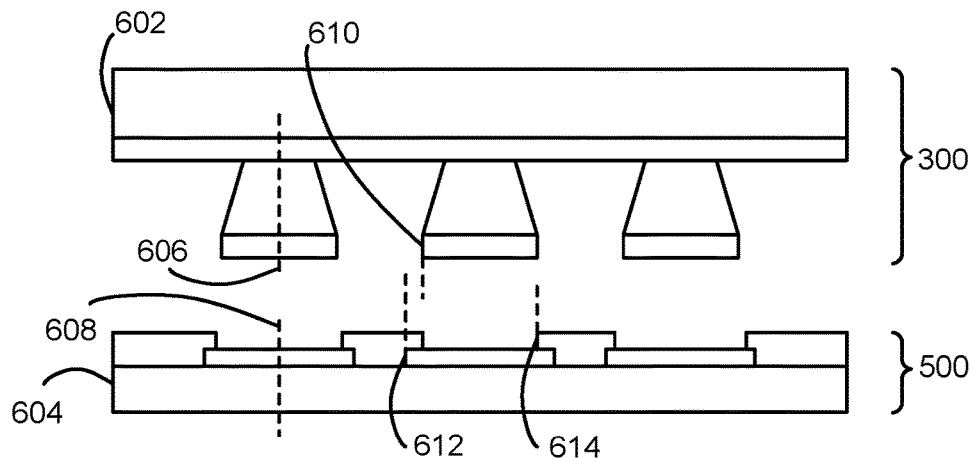
FIG. 6 is a cross-sectional view in an alignment step in manufacturing the integrated circuit system of FIG. 1.

Referring now to FIG. 6, therein is shown a cross-sectional view in an alignment step in manufacturing the integrated circuit system 100 of FIG. 1. The alignment step can align the detachable carrier 300 and the base integrated circuit structure 500 for attaching the terminal structure 202 of FIG. 2, the conductive connector 204 of FIG. 2, or a combination thereof to the semiconductor wafer 102 of FIG. 1.

The detachable carrier 300, separately formed and manufactured as discussed above, can be placed or located over and above the base integrated circuit structure 500. As exemplified in FIG. 6, the detachable carrier 300 and the base integrated circuit structure 500 can be vertically separated with a gap or a clearance across a distance in the vertical direction. The detachable carrier 300, the base integrated circuit structure 500, or a combination thereof can be moved or repositioned along a horizontal direction to align the detachable carrier 300 and the base integrated circuit structure 500.

The detachable carrier 300 and the base integrated circuit structure 500 based on the carrier frame portion 302, the terminal structure 202, the semiconductor wafer 102, the bond pad 206, a portion or an edge thereof, or a combination thereof. The detachable carrier 300 can be provided including a carrier peripheral edge 602 of the carrier frame portion 302, such as a side, an edge, a perimeter, or a combination thereof for the carrier frame portion 302, a conductor reference location 606 of the terminal structure 202, such as a side, an edge, a center portion, a perimeter, or a combination thereof for the terminal structure 202, or a combination thereof.

The base integrated circuit structure 500 can be provided including a base peripheral edge 604 of the semiconductor wafer 102, a pattern reference location 614 of the passivation layer 104, a pad reference location 608 of the bond pad 206, or a combination thereof. The base peripheral edge 604 can include an edge or a perimeter of the semiconductor wafer 102.

The pad reference location 608 can include a known or a recognizable portion of the bond pad 206, such as an edge or a perimeter, a side, a center portion, or a combination thereof of the bond pad 206. The pattern reference location 614 can include an edge or a perimeter, a side, or a combination thereof for the connector pattern 504 of FIG. 5 of the passivation layer 104.

The detachable carrier 300 and the base integrated circuit structure 500 can be aligned based on the base peripheral edge 604, the carrier peripheral edge 602, the pattern reference location 614, the pad reference location 608, the conductor reference location 606, or a combination thereof. For example, the detachable carrier 300 and the base integrated circuit structure 500 can be arranged or moved to have the carrier peripheral edge 602 and the base peripheral edge 604 coplanar along a vertically extending plane.

Also for example, the detachable carrier 300 and the base integrated circuit structure 500 can be arranged or moved to have the conductor reference location 606 and the pad reference location 608 coplanar along a vertically extending plane. As a more specific example, the conductor reference location 606 as a center portion of the terminal structure 202 and the pad reference location 608 as a center portion of the bond pad 206 can be coplanar or along a vertical line or a vertical plane.

Also as a more specific example, the conductor reference location 606 can include a conductor peripheral edge 610, such as an edge or a perimeter of the terminal structure 202, coplanar or along a vertical line or a vertical plane with a pad peripheral edge 612, such as an edge or a perimeter of the bond pad 206. Also as a more specific example, the conductor peripheral edge 610 and the pad peripheral edge 612 can be oriented or located according to a specific orientation, direction, offset, or a combination thereof.

Also for example, the detachable carrier 300 and the base integrated circuit structure 500 can be arranged or moved to have the conductor peripheral edge 610 coplanar or along a vertical line or a vertical plane with the pattern reference location 614. The conductor peripheral edge 610 can be oriented or located according to a specific orientation, direction, offset, or a combination thereof relative to the pattern reference location 614.

Figure 7:
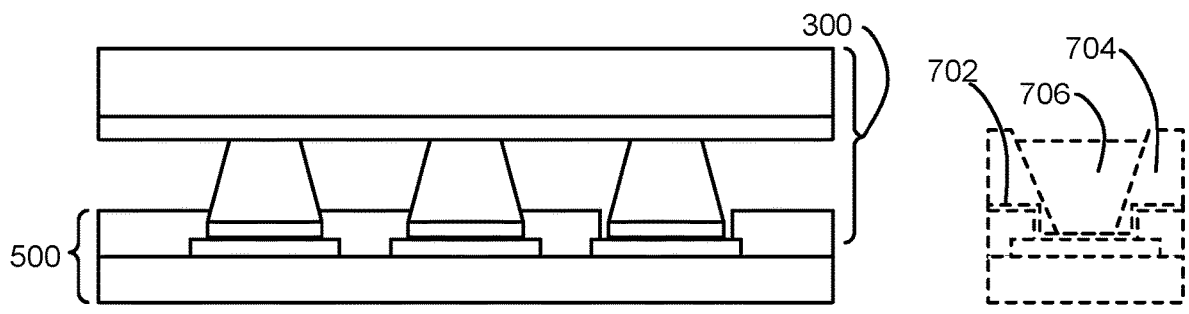
FIG. 7 is a cross-sectional view in an attaching step in manufacturing the integrated circuit system of FIG. 1.

Referring now to FIG. 7, therein is shown a cross-sectional view in an attaching step in manufacturing the integrated circuit system 100 of FIG. 1. The attaching step can be based on removing a separation between the detachable carrier 300 and the base integrated circuit structure 500. The detachable carrier 300 can be lowered, the base integrated circuit structure 500 can be raised, or a combination thereof to remove the vertical separation between the detachable carrier 300 and the base integrated circuit structure 500 as shown in FIG. 6.

The detachable carrier 300 can be attached to the semiconductor wafer 102 of FIG. 1 of the base integrated circuit structure 500. The detachable carrier 300 can be attached by attaching the terminal structure 202 to the bond pad 206. The detachable carrier 300 can be attached to the terminal structure 202 using the conductive connector 204 of FIG. 2. The detachable carrier 300 can be attached with the terminal structure 202 attached to the bond pad 206 of the semiconductor wafer 102 with the terminal structure 202 attached to and directly contacting the release layer 304 of FIG. 3 of the carrier frame portion 302 of FIG. 3.

The semiconductor wafer 102 can be attached to the detachable carrier 300 formed or provided separately from the semiconductor wafer 102. The detachable carrier 300 can be formed separately as discussed above. The semiconductor wafer 102 can be attached to the detachable carrier 300 including the terminal structure 202 having the sintered characteristic 404 of FIG. 4.

The semiconductor wafer 102 can be attached to the detachable carrier 300 including the terminal structure 202. The integrated circuit system 100 can be formed using the detachable carrier 300 without a seed layer 702 and without a photoresist layer 704 on the semiconductor wafer 102. The terminal structure 202 can be formed separate from or away from the bond pad 206 instead of a metal pillar 706.

The metal pillar 706, as an alternative to the terminal structure 202, can be formed using the seed layer 702 including metal material for conducting electric current in a subsequent electroplating step. The seed layer 702 can include refractive metal such as titanium, tungsten, chromium, or an alloy of these as an adhesion layer, followed by a metal that is easily electroplated upon such as copper or nickel. The seed layer 702 can be applied directly on and contacting the semiconductor wafer 102, the bond pad thereon, the passivation layer 104, the seed layer 702, or a combination thereof for forming the metal pillar 706.

The metal pillar 706 can further be formed using the photoresist layer 704. The photoresist layer 704 can be spun directly on or contacting the passivation layer 104, the seed layer 702, or a combination thereof as a liquid film or applied as a dry film. The photoresist layer 704 can include a positive photoresist or a negative photoresist. A via for the metal pillar 706 can be formed in the photoresist layer 704 exposing the seed layer 702 over the bond pad 206. The via can be filled with metal to form the metal pillar 706.

Based on the difference in manufacturing process, such as the sintering step, the terminal structure 202 can include the sintered characteristic 404 of FIG. 4. The terminal structure 202 can further be formed without the seed layer 702 and without the photoresist layer 704 on the semiconductor wafer 102 in comparison to the metal pillar 706. Further, based on the difference in manufacturing process, such as absence of the seed layer 702 and absence of the photoresist layer 704, the integrated circuit system 100 can be without any remnants of the seed layer 702 and without any remnants of the photoresist layer 704.

It has been discovered that the absence of the photoresist layer 704 in forming and attaching the terminal structure 202 provides lower failure rate. The removal of the photoresist layer 704 can be eliminated along with associated potential damage to the semiconductor wafer 102 caused by the removal process.

Figure 8:
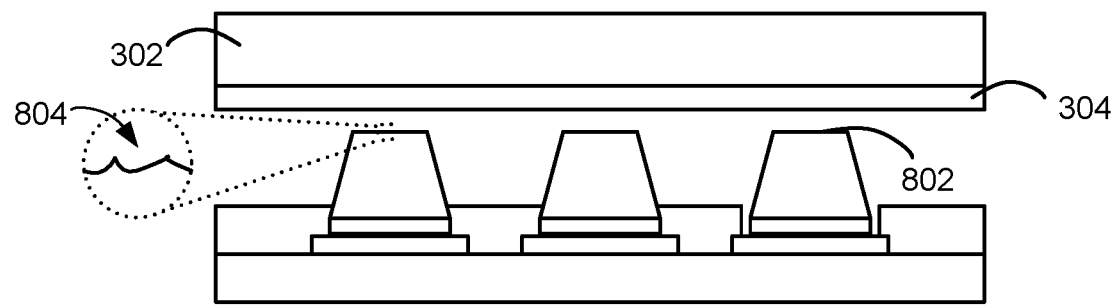
FIG. 8 is a cross-sectional view in a separation step in manufacturing the integrated circuit system of FIG. 1.

Referring now to FIG. 8, therein is shown a cross-sectional view in a separation step in manufacturing the integrated circuit system 100 of FIG. 1. The separation step can include removing the carrier frame portion 302, the release layer 304, or a combination thereof from the terminal structure 202 of FIG. 2.

The carrier frame portion 302, the release layer 304, or a combination thereof can be removed after attaching the terminal structure 202 of the bond pad 206 of FIG. 2 of the semiconductor wafer 102 of FIG. 1. The carrier frame portion 302, the release layer 304, or a combination thereof can be removed by peeling the carrier frame portion 302 along with the release layer 304 away from the terminal structure 202 attached to the bond pad 206. The carrier frame portion 302, the release layer 304, or a combination thereof can be removed with the terminal structure 202 attached to the bond pad 206 and the semiconductor wafer 102.

Removal of the carrier frame portion 302, the release layer 304, or a combination thereof can expose a conductor surface 802 of the terminal structure 202. The conductor surface 802 can include a surface previously connected to the carrier frame portion 302, the release layer 304, or a combination thereof. The conductor surface 802 can be on the terminal structure 202 opposite the bond pad 206.

The conductor surface 802 can include a released-structure characteristic 804. The released-structure characteristic 804 can be a trait of the conductor surface 802 resulting from the terminal structure 202 being formed on the release layer 304 and resulting from removal of the release layer 304. For example, the released-structure characteristic 804 can include irregularities, surface condition, peaks and depressions, or a combination thereof on the conductor surface 802.

Figure 9:
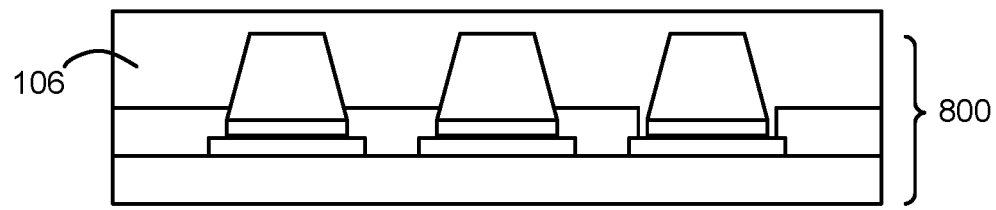
FIG. 9 is a cross-sectional view in an encapsulation step in manufacturing the integrated circuit system of FIG. 1.

Referring now to FIG. 9, therein is shown a cross-sectional view in an encapsulation step in manufacturing the integrated circuit system 100 of FIG. 1. The encapsulation step can include forming the encapsulation 106 encapsulating the semiconductor wafer 102 of FIG. 1, the bond pad 206 of FIG. 2, and the terminal structure 202 of FIG. 2. The encapsulation 106 can be formed directly contacting the semiconductor wafer 102, the bond pad 206, the passivation layer 104, the terminal structure 202, or a combination thereof.

The encapsulation step can include application of resin or polyethylene material, setting or solidifying the material, or a combination thereof to form the encapsulation 106. The encapsulation 106 can be molded in place, sprayed, dipped, or spun directly on the semiconductor wafer 102, the bond pad 206, the terminal structure 202, the passivation layer 104, or a combination thereof. The encapsulation 106 can further include conformal coating that is sprayed, dipped, or sputtered on the semiconductor wafer 102, the bond pad 206, the terminal structure 202, the passivation layer 104, or a combination thereof. The encapsulation 106 can further include a thick film applique.

Figure 10:
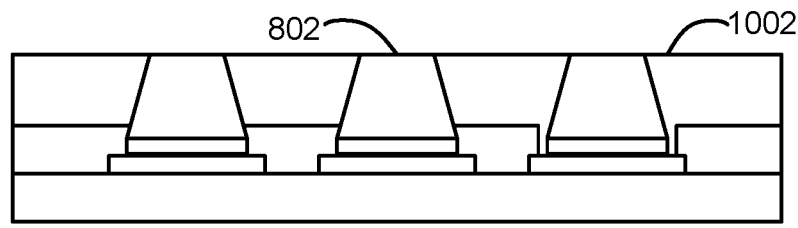
FIG. 10 is a cross-sectional view in an exposure step in manufacturing the integrated circuit system of FIG. 1.

Referring now to FIG. 10, therein is shown a cross-sectional view in an exposure step in manufacturing the integrated circuit system 100 of FIG. 1. The exposure step can include removing a portion of the encapsulation 106 in finalizing the formation of the encapsulation 106. The exposure step can remove the portion of the encapsulation 106 opposite to the semiconductor wafer 102, such as using a physical removal process or a chemical process including chemical mechanical polish (CMP).

The exposure step can form an encapsulation surface 1002 coplanar with the conductor surface 802 of the terminal structure 202. The encapsulation surface 1 can be a top surface of the encapsulation 106 opposite the semiconductor wafer 102 formed by the removal of the portion of the encapsulation 106.

Figure 11:
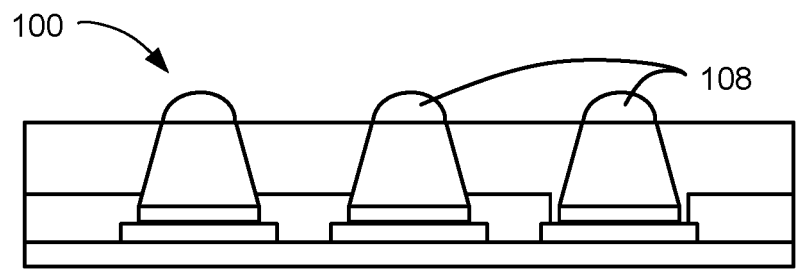
FIG. 11 is a cross-sectional view in a finalization step in manufacturing the integrated circuit system of FIG. 1.

Referring now to FIG. 11, therein is shown a cross-sectional view in a finalization step in manufacturing the integrated circuit system 100. The finalization step can include thinning the base integrated circuit structure 500 of FIG. 5, attaching the solder bump 108, or a combination thereof.

The finalization step can include forming the semiconductor wafer 102 of FIG. 1 based on thinning the base integrated circuit structure 500 exposed from the encapsulation 106. A portion of the base integrated circuit structure 500 opposite from and exposed from the encapsulation 106. For example, the portion can be removed and the semiconductor wafer 102 can be formed based on CMP or physically removing the portion, such as by cutting or shaving the portion. Also for example, the removal can be performed in a plane horizontal to the top face of the semiconductor wafer 102.

The finalization step can further include attaching the solder bump 108 to the terminal structure 202 of FIG. 2. The solder bump 108 can be formed on or attached to the conductor surface 802 of FIG. 8. The solder bump 108 can be formed or attached by a variety of means including ball placement, screening of solder paste, wave solder, solder-jet printing, or dipping. The solder bump 108 can include or be without electroless nickel/immersion gold (ENIG) or electroless nickel/electroless palladium/immersion gold (EN-EPIG). The solder bump 108 can include a gold pad or a solder bump or ball.

Figure 12:
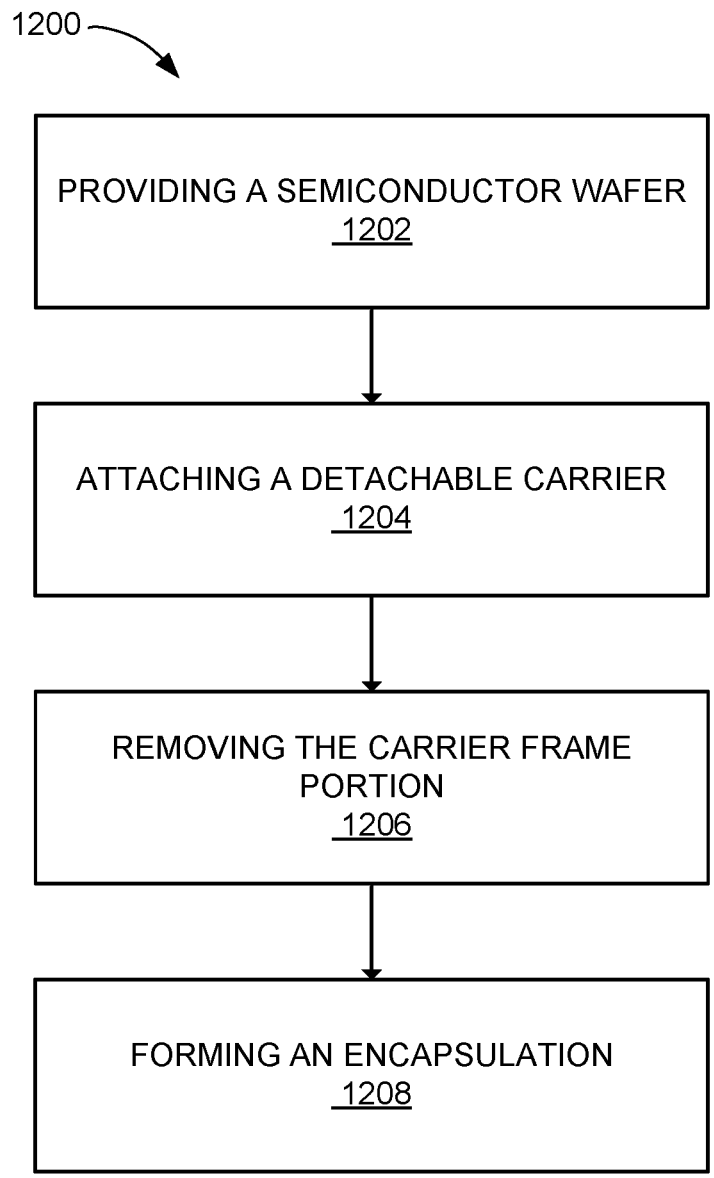
FIG. 12 is a flow chart of a method of manufacture of an integrated circuit system in an embodiment of the present invention.

Referring now to FIG. 12, therein is shown a flow chart of a method 1200 of manufacture of an integrated circuit system in an embodiment of the present invention. The method 1200 includes: providing a semiconductor wafer with a bond pad in a box 1202; attaching a detachable carrier to the semiconductor wafer, the detachable carrier including a carrier frame portion and a terminal structure in a box 1204; removing the carrier frame portion with the terminal structure attached to the semiconductor wafer in a box 1206; and forming an encapsulation encapsulating the semiconductor wafer, the bond pad, and the terminal structure in a box 1208.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A method of manufacture of an integrated circuit system comprising:
   forming a detachable carrier including:
   providing a carrier frame portion;

forming a release layer on a surface of the carrier frame portion;

forming a temporary shaping structure on the release layer after the release layer is formed, the temporary shaping having a void exposing the release layer;

applying a conductive material in the void of the temporary shaping structure and contacting the release layer;

forming a terminal structure by solidifying the conductive material and removing the temporary shaping structure by a heating process;

providing a semiconductor wafer with a bond pad;

after removing the temporary shaping structure, attaching the detachable carrier to the semiconductor wafer by attaching the terminal structure to the bond pad;

removing the carrier frame portion with the terminal structure attached to the bond pad of the semiconductor wafer; and forming an encapsulation to encapsulate the semiconductor wafer, the bond pad, and the terminal structure after removing the carrier frame portion.

2. The method as claimed in claim 1 comprising forming a terminal pod by applying a conductive connector to the end of the terminal structure opposite the release layer.

3. The method as claimed in claim 1 wherein removing the temporary shaping structure includes volatilizing the temporary shaping structure by the heating process.

4. The method as claimed in claim 1 wherein forming the terminal structure includes forming the terminal structure by a sintering process.

5. The method as claimed in claim 1 wherein forming the terminal structure includes forming the terminal structure having a geometric shape wherein the portion of the terminal structure attached to the release layer is smaller than the portion of the terminal structure facing away from the carrier frame portion.

6. The method as claimed in claim 1 wherein forming the temporary shaping structure includes forming the voids as a complementary to the geometric shape for the terminal structure.

7. The method as claimed in claim 1 wherein the release layer provides a detachable bond between the carrier frame portion and the terminal structure.

8. The method as claimed in claim 1 wherein forming the terminal structure includes removing a suspension component from the conductive material.

9. The method as claimed in claim 1 wherein applying the conductive material includes applying the conductive material as a solution or a paste including metallic components.

10. The method as claimed in claim 1 wherein forming the temporary shaping structure includes printing the temporary shaping structure on the release layer.

11. The method as claimed in claim 1 wherein a top surface of the terminal structure is exposed from the encapsulation.

12. The method as claimed in claim 11 comprises attaching a solder bump to the terminal structure.

13. A method of manufacturing an integrated circuit system comprising:
forming a detachable carrier including:
providing a carrier frame portion;
forming a release layer on a surface of the carrier frame portion;

forming a temporary shaping structure on the release layer after the release layer is formed, the temporary shaping having a void exposing the release layer;

applying a conductive material in the void of the temporary shaping structure and contacting the release layer;

forming a terminal structure by solidifying the conductive material and removing the temporary shaping structure;

providing a semiconductor wafer with a bond pad;

after removing the temporary shaping structure, attaching the detachable carrier to the semiconductor wafer by attaching the terminal structure to the bond pad;

removing the carrier frame portion with the terminal structure attached to the bond pad of the semiconductor wafer; and forming an encapsulation to encapsulate the semiconductor wafer, the bond pad, and the terminal structure after removing the carrier frame portion.

14. The method as claimed in claim 13 comprising forming a terminal pod by applying a conductive connector to the end of the terminal structure opposite the release layer.

15. The method as claimed in claim 13 wherein removing the temporary shaping structure includes volatilizing the temporary shaping structure.

16. The method as claimed in claim 13 wherein forming the terminal structure includes forming the terminal structure by a sintering process.

17. The method as claimed in claim 13 wherein forming the terminal structure includes forming the terminal structure having a geometric shape wherein the portion of the terminal structure attached to the release layer is smaller than the portion of the terminal structure facing away from the carrier frame portion.

18. The method as claimed in claim 13 wherein forming the temporary shaping structure includes forming the voids as a complementary to the geometric shape for the terminal structure.

19. The method as claimed in claim 13 wherein the release layer provides a detachable bond between the carrier frame portion and the terminal structure.

20. A method of manufacturing an integrated circuit system comprising:
forming a detachable carrier including:
providing a carrier frame portion;
forming a release layer on a surface of the carrier frame portion;

forming a temporary shaping structure on the release layer after the release layer is formed, the temporary shaping having a void exposing the release layer;

applying a conductive material in the void of the temporary shaping structure and contacting the release layer;

forming a terminal structure by solidifying the conductive material and removing the temporary shaping structure by a heating process;

providing a semiconductor wafer with a bond pad;

attaching the detachable carrier to the semiconductor wafer by attaching the terminal structure to the bond pad;

removing the carrier frame portion with the terminal structure attached to the bond pad of the semiconductor wafer; and forming an encapsulation to encapsulate the semiconductor wafer, the bond pad, and the terminal structure after removing the carrier frame portion.

* * * * *